United States Patent
Nakaoka

(10) Patent No.: US 8,570,815 B2
(45) Date of Patent: Oct. 29, 2013

(54) SEMICONDUCTOR DEVICE AND METHOD OF CONTROLLING THE SAME

(75) Inventor: Yuji Nakaoka, Chuo-ku (JP)

(73) Assignee: Elpida Memory, Inc., Tokyo (JP)

(*) Notice: Subject to any disclaimer, the term of this patent is extended or adjusted under 35 U.S.C. 154(b) by 511 days.

(21) Appl. No.: 12/914,547

(22) Filed: Oct. 28, 2010

(65) Prior Publication Data

US 2011/0102089 A1    May 5, 2011

(30) Foreign Application Priority Data

Oct. 30, 2009  (JP) .................................. 2009-250292

(51) Int. Cl.
*G11C 5/14* (2006.01)

(52) U.S. Cl.
USPC .................. 365/189.09; 365/189.11; 365/226

(58) Field of Classification Search
USPC ......... 365/189.09, 189.11, 226; 323/280–283
See application file for complete search history.

(56) References Cited

U.S. PATENT DOCUMENTS 6,392,951 B2* 5/2002 Fujima et al. ............ 365/230.03
7,362,631 B2* 4/2008 Jang .............................. 365/201

FOREIGN PATENT DOCUMENTS

JP    2001-266573 A    9/2001

* cited by examiner

*Primary Examiner* — Harry W Byrne
*Assistant Examiner* — Lance Reidlinger
(74) *Attorney, Agent, or Firm* — Sughrue Mion, PLLC

(57) ABSTRACT

When overdriving a first power supply voltage supplied to a sense amplifier, a line for the first power supply voltage and a line for a second power supply voltage which is higher than the first power supply voltage are connected to each other by a first transistor, thereby boosting the first power supply voltage. When the first power supply voltage drops upon activation of the sense amplifier, the line for the first power supply voltage and the line for the second power supply voltage are connected to each other by a second transistor, thereby increasing the current supply capability. The first transistor and the second transistor are fully driven to operate as switches.

20 Claims, 7 Drawing Sheets

SEMICONDUCTOR DEVICE AND METHOD OF CONTROLLING THE SAME

BACKGROUND OF THE INVENTION

1. Field of the Invention

The present invention relates to a semiconductor device including sense amplifiers and a method of controlling such a semiconductor device.

2. Description of Related Art

One typical semiconductor device including sense amplifiers is a dynamic semiconductor storage device, for example. The semiconductor storage device has sense amplifiers connected to bit line pairs that are connected to memory cells. The sense amplifier amplifies a small potential voltage difference output from a memory cell to the bit line pair to read data (memory cell information) from the memory cell. As semiconductor storage devices have been integrated to a higher degree in recent years, their storage capacities have increased, but requirements call for reduced electric power consumption and operation at higher speeds.

An effective way to reduce the electric power consumption of a semiconductor storage device is to lower the operating voltage of the internal circuits of the semiconductor storage device. For example, if an external power supply voltage of +1.8 V is applied to a semiconductor storage device, then a voltage lower control circuit in the semiconductor storage device generates internal power supply voltage VINTS of +1.1 V, for example, from the external power supply voltage, and internal power supply voltage VINTS is supplied to a memory cell array (including a plurality of memory cells, a decoder for accessing the memory cells, and sense amplifiers for sensing memory cell information stored in the memory cells). Internal power supply voltage VINTS is a charging voltage for a bit line corresponding to information "1", and is also a high-potential power supply voltage for the sense amplifier which detects the potential voltage of the bit line. If internal power supply voltage VINTS is lowered to reduce the charging voltage for the bit line, then according to the known ½ equalizing scheme, the power supply voltage for the sense amplifier is lowered, and the sensing time is increased. The sensing time refers to the time required after the sense amplifier has started to amplify the potential voltage difference (differential potential) between the bit lines of the bit line pair until the potential voltage difference increases to a prescribed potential voltage difference which is regarded as including a substantially constant value. The prescribed potential voltage difference (the difference between the low bit line potential voltage and the high bit line potential voltage) is of a value which is 95% of internal power supply voltage VINTS, for example.

When reading data from a semiconductor storage device, the general practice is have a word line become active so as to select a memory cell and to transmit the information stored in the memory cell and to bit lines, which initiates operation of a sense amplifier, and thereafter to select a Y-selection signal line with a Y decoder at the time the output potential voltage from the sense amplifier is established, which results in decoding the potential voltage difference between the bit lines and which is output from the sense amplifier. If the sensing time is increased, then because the potential voltage difference between the bit lines is read when the potential voltage difference is not yet sufficiently large, the potential voltage difference cannot be properly read. Consequently, it is necessary to increase the time required after the word line is selected until the Y decoder decodes the potential voltage difference. This means a reduction in the rate at which can be read data from the semiconductor storage device.

In order to reduce the sensing time for realizing high-speed operation of the semiconductor storage device, it has been customary to supply overdrive voltage VOD, that is higher than internal power supply voltage VINTS (VOD>VINTS), to the sense amplifier to increase the VGS (gate-to-source voltage) supplied to each transistor of the sense amplifier with overdrive voltage VOD, thereby operating the sense amplifier at a high speed. Such a process is referred to as an overdrive technique. The overdrive voltage is applied in the initial period of the initial access phase of the semiconductor storage device, for example.

The overdrive technique is described in Japanese Laid-Open Patent Application No. 2001-266573A (hereinafter referred to as "Patent document 1"), for example. Patent document 1 (FIGS. 3, 4, and 11) discloses an internal power supply circuit for generating internal power supply voltage VINTA, which comprises differential amplifier (operational amplifier) 52 for amplifying the difference between reference voltage VREF and internal power supply voltage VINTA, transistor 51 energizable by an output signal from differential amplifier 52, transistor 51 including a source supplied with an external power supply voltage and a drain outputting internal power supply voltage VINTA, and transistor 53 for forcibly connecting the output of differential amplifier 52 to a ground potential voltage when overdrive signal VOP is "high", turning on transistor 51 to connect the line of internal power supply voltage VINTA (VINTS) and the line of the external power supply voltage to each other.

During a period in which overdrive signal VOP is "high", the internal power supply circuit disclosed in Patent document 1 connects the line of internal power supply voltage VINTA to the line of the external power supply voltage, thereby overdriving the power supply voltage supplied to a sense amplifier. During a period in which overdrive signal VOP is "low", the drain of transistor 51 outputs internal power supply voltage VINTA which is equal to reference voltage VREF.

As described above, Patent document 1 reveals that overdrive signal VOP is rendered "high" only during a certain period at the time when the sense amplifier starts its sensing process (initial sensing period). Usually, a one-shot pulse signal is used as overdrive signal VOP. The pulse duration of the one-shot pulse signal varies with PVT (process, voltage, temperature) variations. If overdrive signal VOP is shorter than the designed time, then the sensing time of the sense amplifier is prolonged. If overdrive signal VOP is longer than the designed time, then since the period in which the bit line voltage that is higher than a given voltage (reference voltage VREF) is elongated, this results in an increase in the electric power consumption of the semiconductor storage device. Accordingly, the internal power supply circuit disclosed in Patent document 1 is problematic in that it fails to provide a stable overdrive effect.

The internal power supply circuit disclosed in Patent document 1 is arranged such that it controls the differential amplifier to equalize internal power supply voltage VINTA and reference voltage VREF to each other after the end of the overdrive period. Therefore, transistor 51 consumes an amount of electric power which is commensurate with the potential voltage difference between the external power supply voltage and the internal power supply voltage VINTA. Since transistor 51 that supplies internal power supply voltage VINTA needs to be increased in size to deal with an overdrive period (initial sensing period) in which the load current is of a relatively large value, the electric power consumption of differential amplifier 52 which energizes transistor 51 accordingly is necessarily large.

SUMMARY

In one embodiment, there is provided a semiconductor device comprising:

a sense amplifier;

a first power supply line supplying a high-potential voltage equal to or higher than a first power supply voltage to the sense amplifier;

a second power supply line supplying a second power supply voltage higher than the high-potential voltage;

a first transistor, a second transistor, and a third transistor including respective drain terminals and source terminals connected between the first power supply line and the second power supply line; and a first control circuit, a second control circuit, and a third control circuit applying a first control signal, a second control signal, and a third control signal, respectively, to gate terminals of the first transistor, the second transistor, and the third transistor;

wherein the second control circuit and the third control circuit including a first operational amplifier and a second operational amplifier, respectively;

the first control signal and the second control signal comprise digital signals including a first differential voltage between the first power supply voltage and a ground voltage and including a potential voltage that is selectively changeable to two values represented by the first power supply voltage and the ground voltage, respectively;

the third control signal comprises an analog signal including a second differential voltage smaller than the first differential voltage and including a potential voltage that is changeable between the first power supply voltage and the ground voltage, respectively;

the first control circuit generates the first control signal to render the first transistor electrically conductive or nonconductive;

the second control circuit generates the second control signal which is a digital signal converted from an analog signal detected by the first operational amplifier to render the second transistor electrically conductive or nonconductive; and the third control circuit outputs an analog signal detected by the second operational amplifier as the third control signal to render the third transistor electrically conductive or nonconductive.

With the above semiconductor device, after the first transistor is rendered conductive, a load current flows through the sense amplifier, causing the first power supply voltage to drop from a prescribed potential voltage. Then, the second transistor is rendered conductive, assisting in an overdrive mode even if the pulse duration of a one-shot pulse signal used as an overdrive signal varies with PVT variations. Therefore, the first power supply voltage is prevented from dropping, thus providing a stable overdrive effect.

Since the first transistor and the second transistor operate as switches, electric power consumption of the first transistor and the second transistor is reduced.

In another embodiment, there is also provided a method of controlling a semiconductor device, comprising:

when a memory cell is accessed, controlling a first transistor to change a power supply voltage for a sense amplifier to a second power supply voltage which is higher than a first power supply voltage;

activating the sense amplifier to sense information of the memory cell;

controlling a second transistor to bring the power supply voltage for the sense amplifier to coincide with the first power supply voltage when the power supply voltage for the sense amplifier changes to a voltage which is lower than the first power supply voltage upon sensing the information of the memory cell;

controlling a third transistor to bring the power supply voltage for the sense amplifier to coincide with the first power supply voltage after at least the first transistor and the second transistor have been controlled; and continuously controlling the second transistor after at least the first transistor has been controlled.

Consequently, a stable overdrive effect is provided, and electric power consumption of the semiconductor device is reduced.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

A semiconductor device according to the present invention, when overdriving internal power supply voltage VINTS is supplied to sense amplifier SA, a line for internal power supply voltage VINTS and a line for external power supply voltage VDD, which is higher than internal power supply voltage VINTS, are connected to each other by a first transistor (transistor Q1) under digital control, thereby boosting internal power supply voltage VINTS. When internal power supply voltage VINTS drops due to a load current flowing into the sense amplifier upon activation of the sense amplifier, the line for internal power supply voltage VINTS and the line for external power supply voltage VDD are connected to each other by a second transistor (transistor Q2) which is under digital control, thereby increasing the current supply capability of internal power supply voltage VINTS. The first transistor and the second transistor are driven with a full amplitude value to operate as switches by a control signal including a potential voltage changeable to two values represented by ground potential voltage VSS and external power supply voltage VDD, the control signal being applied as a VGS (gate-to-source voltage). In a period except for an overdrive period used as an initial period of an initial access phase in which a plurality of memory cells are accessed at once, the level of internal power supply voltage VINTS that is supplied to sense amplifier SA is maintained by a regulator which is operated under analog control by an operational amplifier. The digital control refers to a process wherein either external power supply voltage VDD or ground voltage VSS is applied to the gate terminal of the transistor, which is connected to the output terminal of an inverter, for example. The analog control refers to a process wherein the voltage between external power supply voltage VDD and ground voltage VSS is applied to the gate terminal, which is connected to the output terminal of an operational amplifier, for example. These definitions are well known to those skilled in the art, and will subsequently be used in the description. The digital control and the analog control may be referred to simply as "digital" and "analog".

The present invention will be described in detail below with reference to the drawings.

1st Exemplary Embodiment

Figure 1:
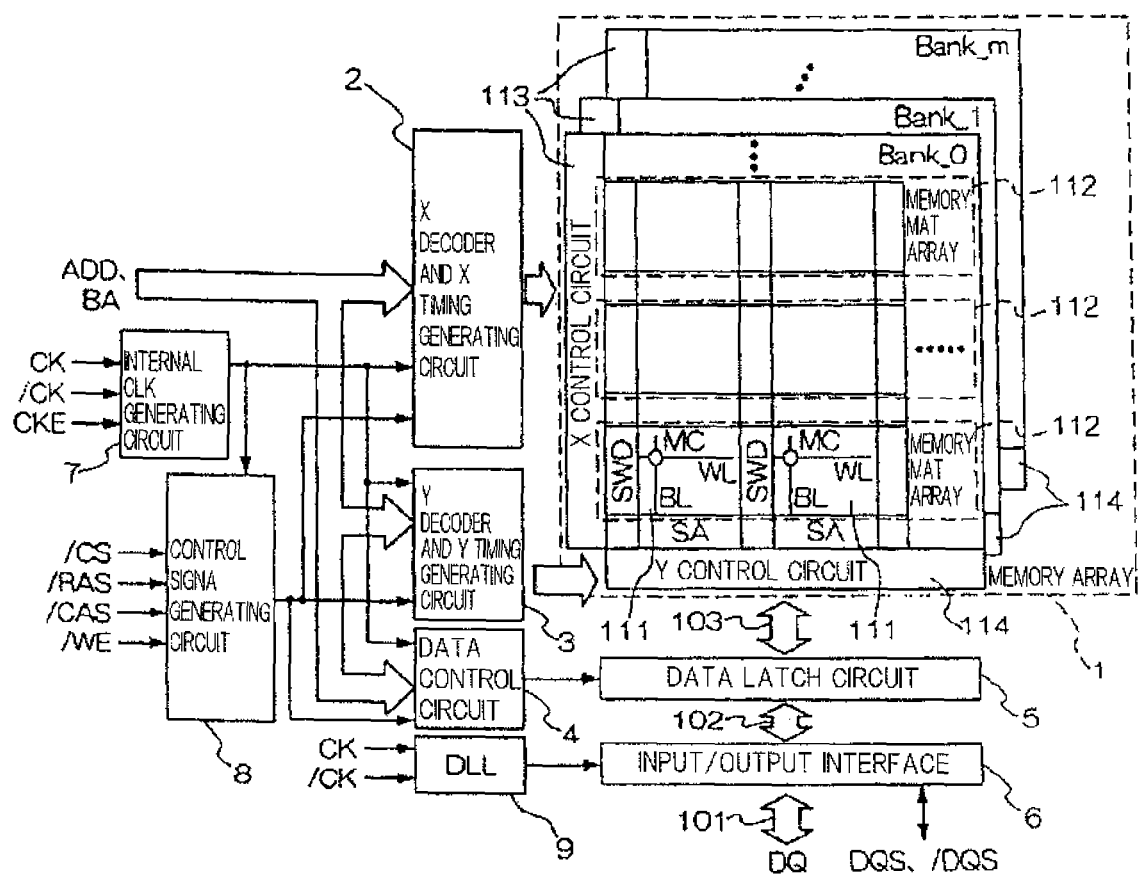
FIG. 1 is a block diagram showing the overall configuration of a general DRAM as a semiconductor device according to a first exemplary embodiment of the present invention.

FIG. 1 is a block diagram showing an overall configuration of a general DRAM (Dynamic Random Access Memory) as a semiconductor device according to a first exemplary embodiment of the present invention. As shown in FIG. 1, the semiconductor device comprises memory array 1, X decoder and X timing generating circuit 2, Y decoder and Y timing generating circuit 3, data control circuit 4, data latch circuit 5, input/output interface 6, internal CLK (clock) generating circuit 7, control signal generating circuit 8, and DLL (Delay Locked Loop) circuit 9.

Memory array 1 comprises a number of memory cells MC for holding data (memory cell information) and is connected to data latch circuit 5 by data transfer bus 103. Data latch circuit 5 is connected to input/output interface 6 by data transfer bus 102. Input/output interface 6 inputs and outputs data (DQ) and also inputs and outputs data strobe signals DQS, /DQS from and to an external circuit through data transfer bus 101. The data transfer between memory array 1 and data latch circuit 5 and between data latch circuit 5 and input/output interface 6 is controlled by data control circuit 4. The timing to input and output data (DQ) and data strobe signals DQS, /DQS to and from input/output interface 6 is controlled by a timing signal that is generated by DLL circuit 9 based clock signals CK, /CK.

Memory array 1 includes a plurality of memory mats 111 comprising a plurality of memory cells MC disposed at the intersections of a plurality of word lines WL and a plurality of bit lines BL. An array of memory mats 111 serves as memory mat array 112, and a plurality of memory mat arrays 112 make up a bank. In FIG. 1, memory array 1 includes (m+1) banks (Bank_0, Bank_1, . . . , Bank_m) where m represents an integer of 1 or greater. The banks are independently accessible from outside of memory array 1 under nonexclusive control. Memory mats 111 are accessible under nonexclusive control.

Each memory mat 111 is surrounded by sense amplifier area SA including a sense amplifier array which comprises a plurality of sense amplifiers for amplifying information read from memory cells MC and subword driver area SWD including a subword driver array which comprises a plurality of subword driver circuits for driving a plurality of word lines WL.

Memory array 1 is controlled by X decoder and X timing generating circuit 2 and Y decoder and Y timing generating circuit 3, which are controlled by control signal generating circuit 8. In particular, X decoder and X timing generating circuit 2 controls X control circuits 113 of the respective banks, and Y decoder and Y timing generating circuit 3 controls Y control circuits 114 of the respective banks.

Internal clock circuit 7 generates an internal clock signal to be supplied to X decoder and X timing generating circuit 2, Y decoder and Y timing generating circuit 3, and control signal generating circuit 8, based on clock signals CK, /CK and clock enable signal CKE supplied from an external circuit. Control signal generating circuit 8 generates and outputs control signals to X decoder and X timing generating circuit 2, Y decoder and Y timing generating circuit 3, and data control circuit 4 based on chip select signal /CS, row address strobe signal /RAS, column address strobe signal /CAS, and write enable signal /WE. Addresses ADD and bank addresses BA are given to X decoder and X timing generating circuit 2, Y decoder and Y timing generating circuit 3, and data control circuit 4.

The semiconductor circuit shown in FIG. 1 also includes a plurality of voltage lower control circuits and booster circuits, not shown, for generating predetermined internal power supply voltages from an external power supply voltage.

Figure 2:
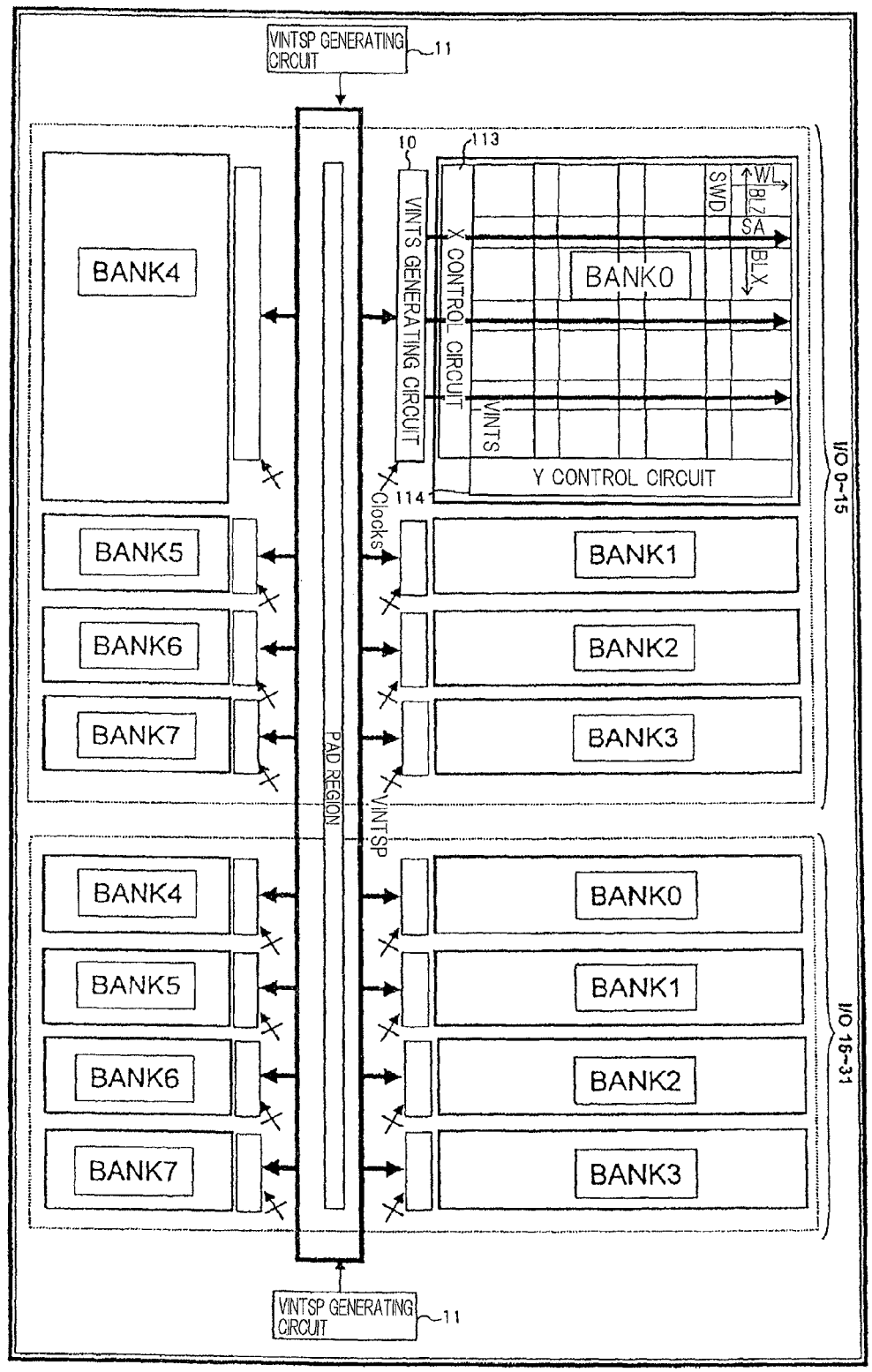
FIG. 2 is a diagram showing by way of example the layout of the semiconductor device shown in FIG. 1.

FIG. 2 is a diagram showing by way of example the layout of the semiconductor device shown in FIG. 1. As shown in FIG. 2, the semiconductor device includes a plurality of banks and a pad (PAD) region.

The pad region includes a plurality of pads for inputting various control signals (CK, /CK, CKE, /CS, /RAS, /CAS, /WE, DQS, /DQS, etc.) and an external power supply voltage and for inputting and outputting data (I/O, 0 through 31), and various control circuits including X decoder and X timing generating circuit 2, Y decoder and Y timing generating circuit 3, data control circuit 4, data latch circuit 5, input/output interface 6, internal CLK (clock) generating circuit 7, control signal generating circuit 8, and DLL circuit 9 shown in FIG. 1.

The semiconductor device shown FIG. 2 has eight banks (BANKs 0 through 7) corresponding to bits I/O, 0 through 15 of the input and output data, eight banks (BANKs 0 through 7) corresponding to bits I/O, 16 through 31 of the input and output data. The pad region is disposed between BANKs 0 through 3 for the bits I/O, 0 through 32 and BANKs 4 through 7 for the bits I/O, 0 through 32.

Each of the banks is combined with X control circuit 113, Y control circuit 114, and VINTS generating circuit 10 for generating internal power supply voltage VINTS. VINTSP generating circuit 11, to be described later, is disposed near the pad region. VINTSP generating circuit 11 supplies internal power supply voltage VINTS to each bank, in place of VINTS generating circuit 10, when the semiconductor device is in a device standby mode (the semiconductor device is supplied with electric power, but is inactive (not operated) with no access from outside of the semiconductor device). VINTSP generating circuit 11 is shared by the banks. VINTS generating circuits 10 are combined with the respective banks, and operate when their corresponding banks are selected.

Figure 3:
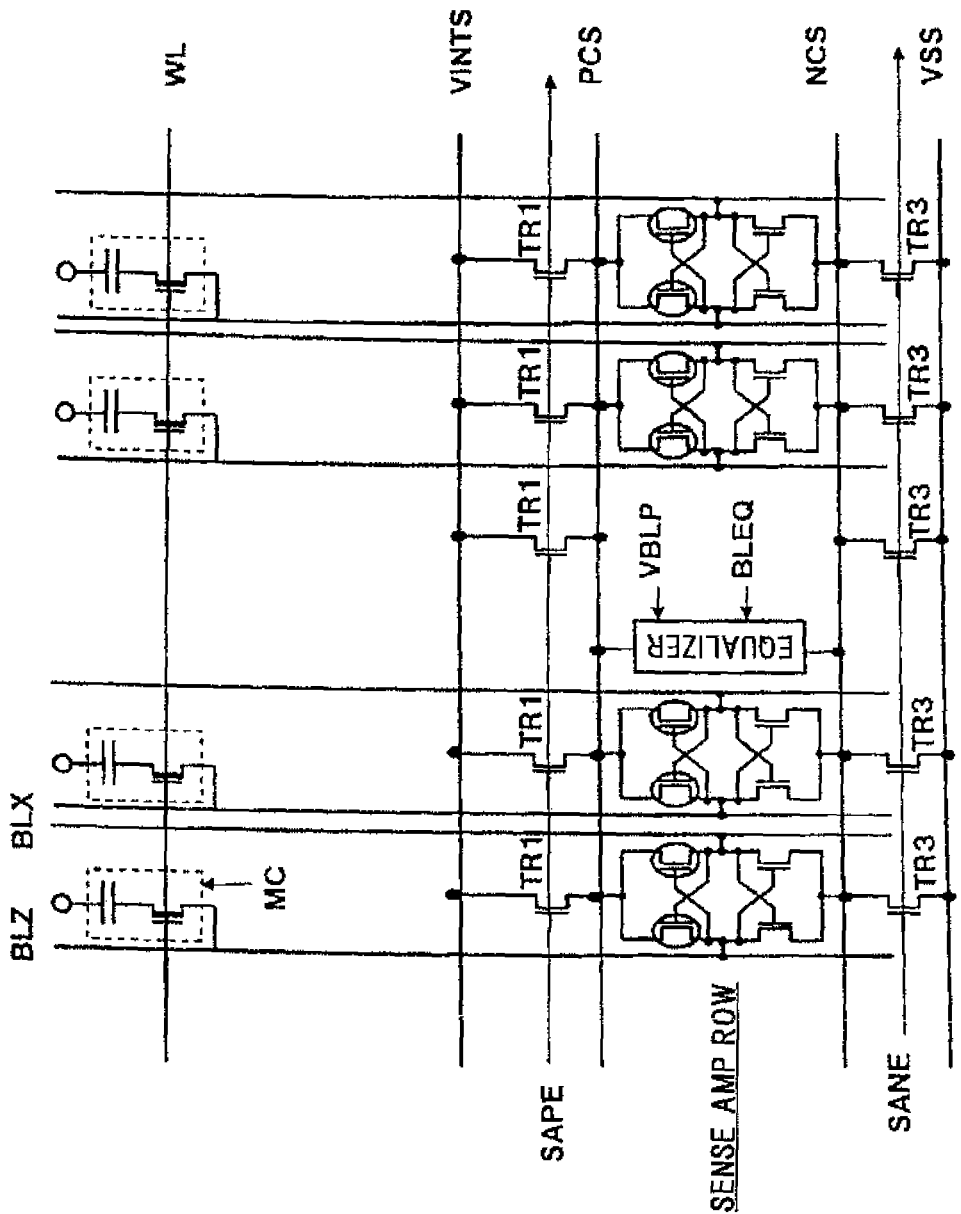
FIG. 3 is a circuit diagram showing a configurational example of sense amplifiers of the semiconductor device shown in FIG. 1.

FIG. 3 is a circuit diagram showing a configurational example of sense amplifiers of the semiconductor device shown in FIG. 1.

FIG. 3 shows a configurational example of standard memory cells MC each comprising one transistor and one capacitor. The transistors of memory cells MC have respective gates connected to word line WL which extends horizontally in FIG. 3, i.e., in a Y-axis direction, so that memory cells MC are arranged in a row in FIG. 3. The transistors of memory cells MC have respective drains connected respectively to a plurality of bit lines BLZ which extend vertically in FIG. 3, i.e., in an X-axis direction. Though only one row of memory cells is illustrated in FIG. 3, each memory mat includes a plurality of rows of memory cells MC. The transistors of a plurality of memory cells belonging to columns (not shown) which are paired with the columns of the memory cells connected to bit lines BLZ shown in FIG. 3 have respective drains connected to a plurality of bit lines BLX. Bit lines BLZ and bit lines BLX make up bit line pairs.

Sense amplifier SA comprises a flip-flop circuit including two cross-coupled inverters, and is of a general configuration comprising two P-channel FETs and two N-channel FETs. Sense amplifier SA has two input nodes connected respectively to bit line BLZ and bit line BLX. Sense amplifier SA is connected to each bit line pair. Therefore, a plurality of sense amplifiers are arranged in a horizontal array in FIG. 3, making up a sense amplifier row.

The sense amplifier row includes a high-potential drive signal line, i.e., a line (PCS) for a P-channel sense amplifier drive signal (first drive signal line), and a low-potential drive signal line, i.e., a line (NCS) for an N-channel sense amplifier drive signal (second drive signal line). Each of sense amplifiers SA is connected to lines PCS, NCS. An equalizer (first equalizer) for equalizing the potential voltages on lines PCS, NCS to potential voltage VBLP with equalizing signal BLEQ is also connected to lines PCS, NCS. The equalizer sets the potential voltages on lines PCS, NCS to an equalizing potential voltage (potential voltage VBLP) when the sense amplifiers are inactive. Potential voltage VBLP is one-half of internal power supply voltage VINTS, for example.

Although not shown, each bit line pair is associated with a similar equalizer for equalizing the potential voltages on bit lines BLZ, BLX to potential voltage VBLP with equalizing signal BLEQ.

Line PCS supplies internal power supply voltage VINTS to sense amplifiers SA at a predetermined operation timing, and line NCS supplies ground potential voltage VSS to sense amplifiers SA at a predetermined operation timing. Therefore, the sense amplifier row also includes a line for supplying ground potential voltage VSS and a line (first line) for supplying internal power supply voltage VINTS. The sense amplifier row further includes lines for supplying timing signals SANE, SAPE to control the operation of the sense amplifiers at predetermined timings. A plurality of transistors TR1 which are turned on and off under control of timing signal SAPE are connected between the line for supplying internal power supply voltage VINTS and line PCS. Transistors TR1 are associated respectively with sense amplifiers SA and disposed closely to sense amplifiers SA. A plurality of transistors TR3 which are turned on and off under control of timing signal SANE are connected between line NCS and ground potential voltage VSS. Transistors TR3 are also associated respectively with sense amplifiers SA. The first equalizer, transistors TR1, and transistors TR3 are disposed in a crossing region where sense amplifier area SA and subword driver area SWD cross each other.

Figure 4:
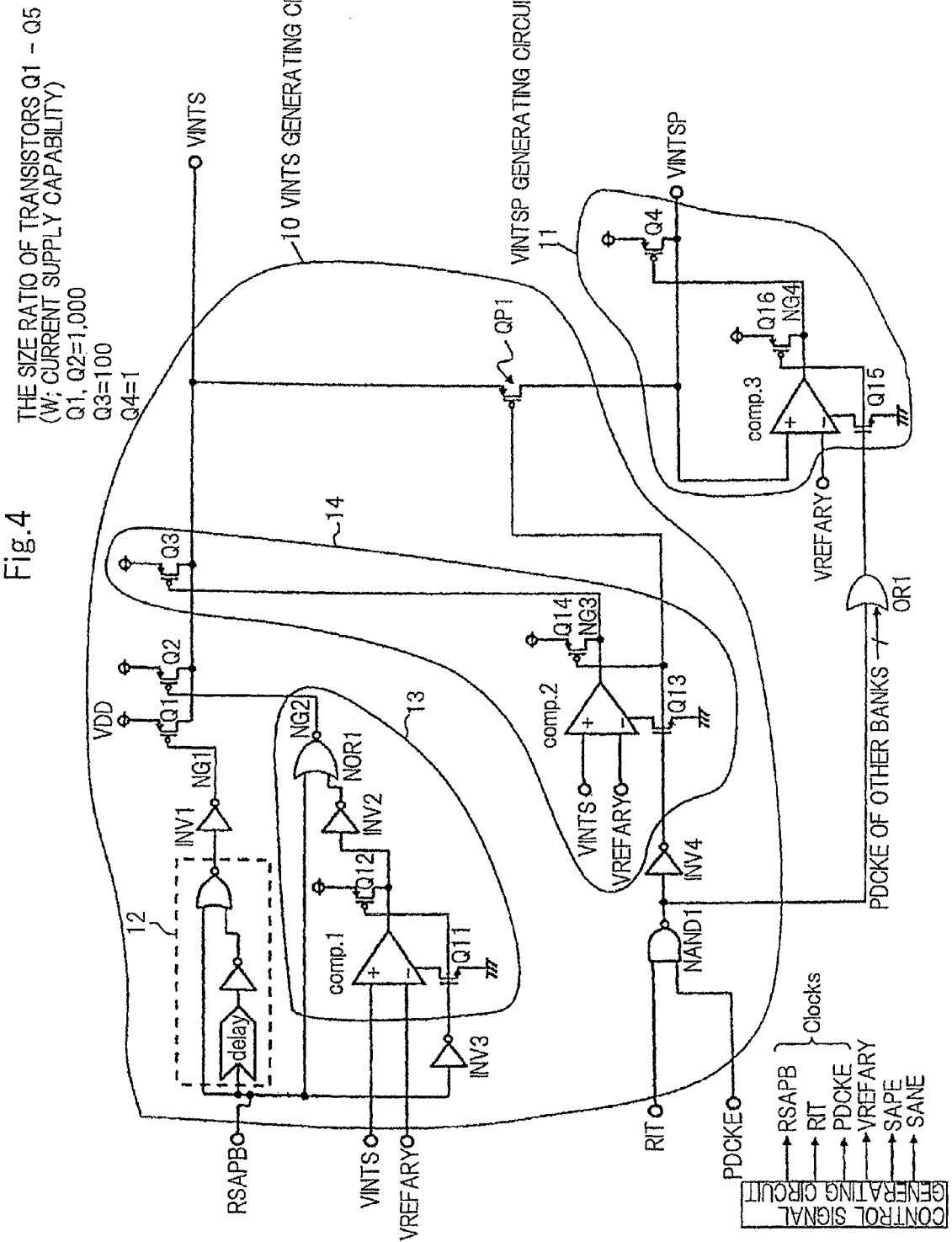
FIG. 4 is a circuit diagram showing a configurational example of a VINTS generating circuit and a VINTSP generating circuit shown in FIG. 2.
Figure 5:
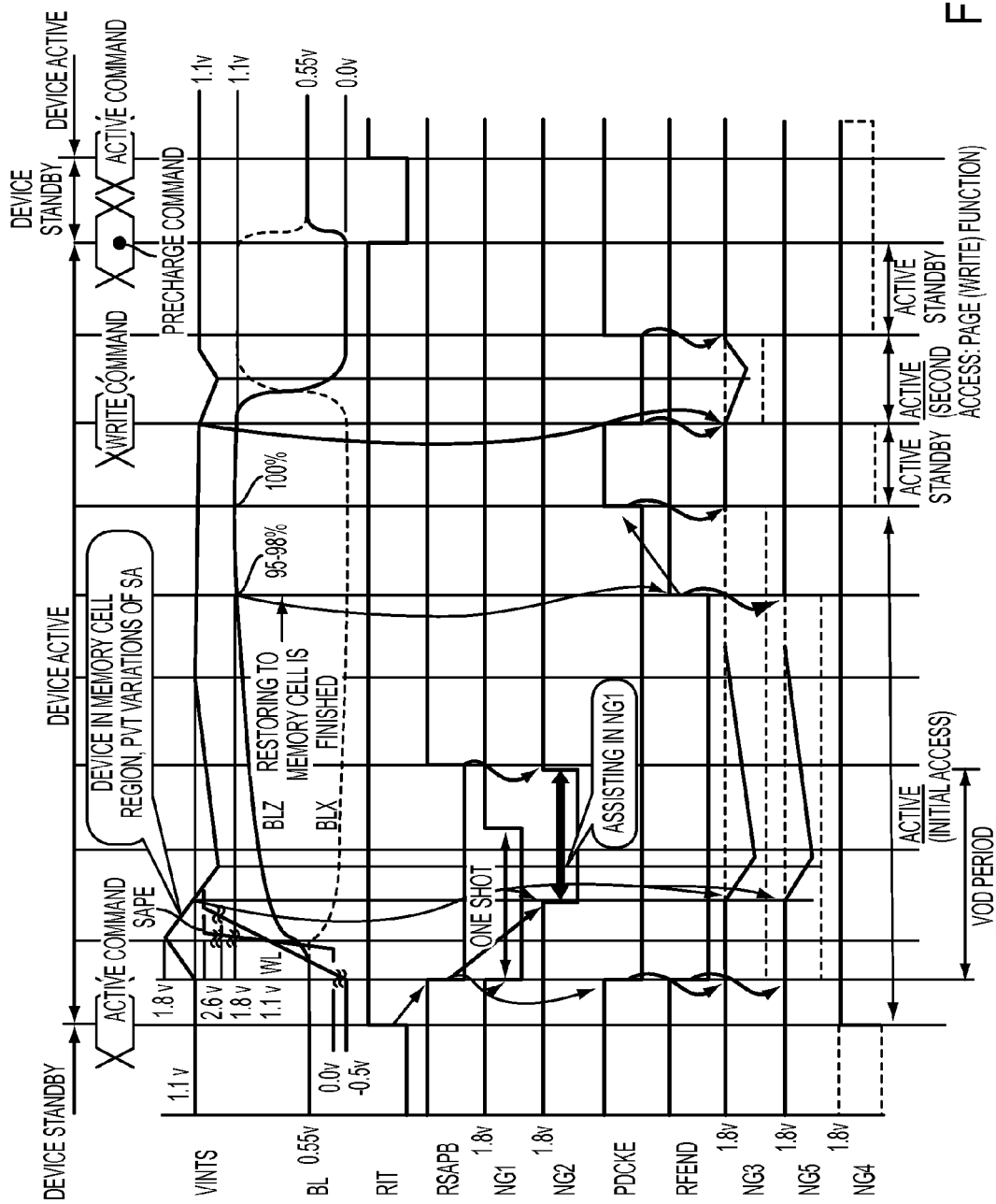
FIG. 5 is a timing chart showing an operational example of the semiconductor device according to the first exemplary embodiment.
Figure 6:
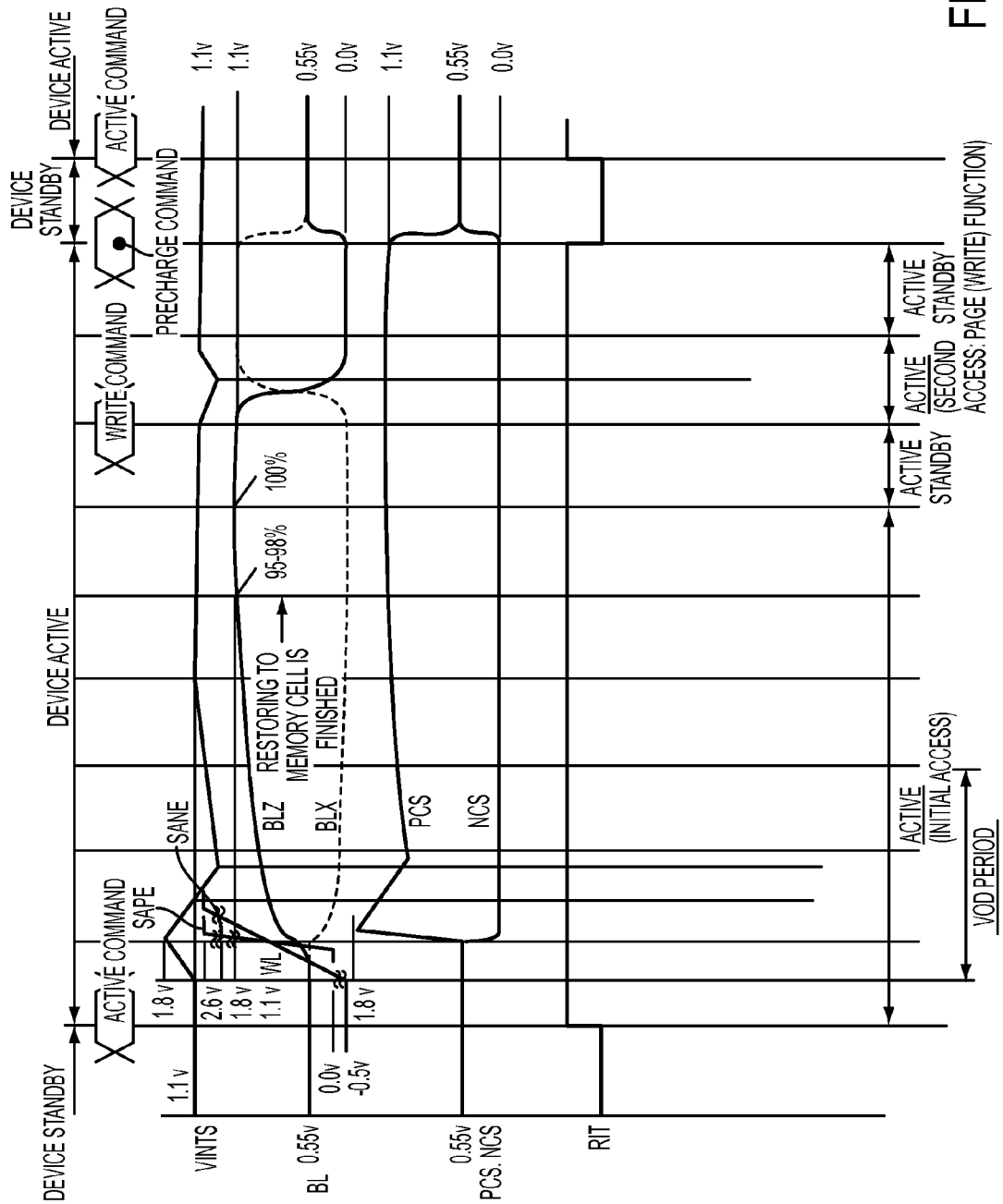
FIG. 6 is a timing chart showing an operational example of the semiconductor device according to the first exemplary embodiment.

FIG. 4 is a circuit diagram showing a configurational example of the VINTS generating circuit and a VINTSP generating circuit shown in FIG. 2. FIGS. 5 and 6 are timing charts showing operational examples of the semiconductor device according to the first exemplary embodiment.

VINTS generating circuit 10 is a circuit for generating internal power supply voltage VINTS when the semiconductor device according to the present exemplary embodiment is in a device active mode. VINTSP generating circuit 11 is a circuit for generating internal power supply voltage VINTS (VINTSP) when the semiconductor device according to the present exemplary embodiment is in a device standby mode or an active standby mode to be described later. Even when the semiconductor device is in the device standby mode, an unintended leakage current flows in the sense amplifiers, etc. VINTSP generating circuit 11 is included to prevent the internal power supply voltage VINTS from dropping due to such a leakage current (load current).

The device active mode refers to a period in which the semiconductor device is accessed from an external circuit. The start of this period is defined by an active command, for example. The device standby mode refers to a period other than the device active mode while the semiconductor device is being switched on.

The device active mode includes an initial access period, an active standby period, and a second access period (page [write] function). The initial access period is also referred to as a first access period. In the initial access period, a corresponding event is initiated by access from an external circuit. In the second access period, a corresponding event is not initiated unless a write command is input from an external circuit. This is because in DRAMs an active command is defined as representing a read mode for reading information from the memory cells of the semiconductor device and a write command is defined as representing a mode opposite to the read mode. When the active command is entered, the circuits ranging from memory array 1 in the back end to data latch circuit 5 in the front end are activated, and when the read command is entered, input/output interface 6 is activated, which is well known among those skilled in the art. The active standby period represents the device active period from which the initial access period and the second access period are excluded. In the active standby period, the bit lines for reading or writing information are charged nearly 100% of a given voltage (internal power supply voltage VINTS), activating word lines WL and sense amplifiers SA. While sense amplifiers SA are being activated, the current consumed thereby is of a level which is small enough to hold the sensed data.

As shown in FIG. 4, VINTS generating circuit 10 includes pulse generating circuit (first control circuit) 12, voltage compensating circuit (second control circuit) 13 for preventing internal power supply voltage VINTS from dropping, first transistor Q1 (first switch) and transistor Q2 (second switch), whose gates are held under digital control, for connecting and disconnecting the line for supplying internal power supply voltage VINTS and a line for supplying external power supply voltage VDD, and first regulator (third control circuit) 14 for generating internal power supply voltage VINTS. First regulator 14 includes an operational amplifier (comp.2) and transistor Q3 whose gate is connected to the output terminal of the operational amplifier and is held under analog control. VINTSP generating circuit 11 includes transistor Q4 whose gate is controlled by an analog signal. The analog signal has an analog characteristic. As described above, first transistor Q1 (first switch) and transistor Q2 (second switch) are devices under digital control, and transistor Q3 and transistor Q4 are devices under analog control. The terms "connected" and "disconnected" mean "rendered electrically conductive" and "rendered electrically nonconductive", respectively. This definition will subsequently be used in the description.

Pulse generating circuit 12 generates a pulse signal including a prescribed pulse duration from signal RSAPB which represents an overdrive period (VOD period). Pulse generating circuit 12 comprises a delay circuit, an inverter, and a NOR circuit which are known in the art, and generates a one-shot pulse signal whose pulse duration is determined by the delay time of the delay circuit. The one-shot pulse signal generated by pulse generating circuit 12 is output to inverter INV1, which outputs signal NG1 representing the inverted one-shot pulse signal. Signal NG1 is a digital signal that serves as a first control signal. According to signal NG1, transistor Q1 is turned on (rendered conductive) or turned off (rendered nonconductive), connecting or disconnecting the line for supplying internal power supply voltage VINTS and the line for supplying external power supply voltage VDD. The pulse duration of the one-shot pulse signal generated by pulse generating circuit 12 is set to a relatively short time so as not to cause too high a charging voltage for the high-potential bit line, i.e., bit line BLZ or BLX. The first control signal (NG1) is activated before timing signal SAPE for controlling sense amplifiers SA is activated. Therefore, transistor Q1 is activated in the period (time) of a prescribed pulse duration generated based on signal RSAPB during the VOD period in the device active mode (initial access period). The terms "turned on" and "turned off" mean "rendered electrically conductive" and "rendered electrically nonconductive", respectively. This definition will remain the same in the description.

Voltage compensating circuit 13 includes differential amplifier comp.1, transistor Q11 for activating or inactivating differential amplifier comp.1, transistor Q12 for securing the output signal from differential amplifier comp.1 at a high level (VDD) when differential amplifier comp.1 is shut down (inactivated), inverter INV2 for inverting the output signal from differential amplifier comp.1, and NOR circuit NOR1 for NORing the output signal from inverter INV2 and signal RSAPB and energizing transistor Q2 under digital control. NOR circuit NOR1 outputs signal NG2 to transistor Q2. Signal NG2 is a digital signal that serves as a second control signal.

Transistor Q11 is supplied with signal RSAPB whose pulse duration is longer than the first control signal (NG1) generated by pulse generating circuit 12, through inverter INV3. Differential amplifier comp.1 is turned on (activated) during a period in which signal RSAPB is significant, e.g., low. In other words, differential amplifier comp.1 is activated in the VOD period.

When transistor Q11 is turned on, differential amplifier comp.1 compares internal power supply voltage VINTS and reference voltage VREFARY with each other. If internal power supply voltage VINTS is lower than reference voltage VREFARY, differential amplifier comp.1 outputs a signal which is high. If internal power supply voltage VINTS is higher than reference voltage VREFARY, differential amplifier comp.1 outputs a signal which is low. Internal power supply voltage VINTS is a final drive voltage during the operational period of sense amplifiers SA. In the overdrive period (VOD period), internal power supply voltage VINTS is controlled to be an initial drive voltage ($\approx$external power supply voltage VDD) that is higher than the final drive voltage. Reference voltage VREFARY is the same as internal power supply voltage VINTS that is controlled to be the final drive voltage. When the output signal from differential amplifier comp.1 is low, transistor Q2 is turned on, connecting the line for internal power supply voltage VINTS and the line for external power supply voltage VDD to each other to prevent internal power supply voltage VINTS from dropping and to increase the current supply capability of VINTS generating circuit 10. Transistor Q2 is activated during the VOD period when internal power supply voltage VINTS is lower than reference voltage VREFARY.

First regulator 14 includes differential amplifier comp.2, transistor Q13 for activating or inactivating differential amplifier comp.2, transistor Q14 for securing the output signal from differential amplifier comp.2 at a high level (VDD) when differential amplifier comp.2 is shut down (inactivated), and transistor Q3 which is controlled by an analog signal, transistor Q3 including a source for being supplied with external power supply voltage VDD, a gate for being supplied with the output signal from differential amplifier comp.2 and a drain for outputting internal power supply voltage VINTS.

Transistor Q13 is supplied with a signal generated by ANDing signal R1T and signal PDCKE with NAND circuit NAND1 and inverter INV4. Signal R1T indicates that the semiconductor device is in the device active mode. Signal PDCKE indicates that the memory cells are being accessed (in a period until the memory cells are restored by 100%). Differential amplifier comp.2 is activated in the initial access period and the second access period (page [write] function) of the device active mode.

When transistor Q13 is turned on, differential amplifier comp.2 amplifies the difference between internal power supply voltage VINTS and reference voltage VREFARY, and outputs the amplified difference as a third control signal to energize transistor Q3. Since internal power supply voltage VINTS is applied through a feedback loop to differential amplifier comp.2, differential amplifier comp.2 and transistor Q3 operate to bring internal power supply voltage VINTS to coincide with reference voltage VREFARY. Therefore, transistor Q3 is activated when internal power supply voltage VINTS is lower than reference voltage VREFARY.

VINTSP generating circuit (fourth control circuit) 11 includes differential amplifier comp.3, transistor Q15 for activating or inactivating differential amplifier comp.3, transistor Q16 for securing the output signal from differential amplifier comp.3 at a high level (VDD) when differential amplifier comp.3 is shut down (inactivated), and transistor Q4 which is controlled by an analog signal, transistor Q4 including a source for being supplied with external power supply voltage VDD, a gate for being supplied with the output signal from differential amplifier comp.3 and a drain for outputting internal power supply voltage VINTSP. When first regulator 14 is inactivated, VINTSP generating circuit 11 operates as a regulator (second regulator) to maintain the level of internal power supply voltage VINTSP in place of first regulator 14.

Transistor Q15 is supplied with the output signal from NAND circuit NAND1 via OR circuit OR1 which ORs the output signal from NAND circuit NAND1 and signal PDCKE from another bank. Therefore, differential amplifier comp.3 is activated in the active standby period and the device standby period.

When transistor Q15 is turned on, differential amplifier comp.3 amplifies the difference between internal power supply voltage VINTSP and reference voltage VREFARY, and outputs the amplified difference as a fourth control signal to energize transistor Q4. Since internal power supply voltage VINTSP is applied through a feedback loop to differential amplifier comp.3, differential amplifier comp.3 and transistor Q4 operate to bring internal power supply voltage VINTSP to coincide with reference voltage VREFARY. Therefore, transistor Q4 is activated during the active standby period and the device standby period when internal power supply voltage VINTSP is lower than reference voltage VREFARY.

The line for internal power supply voltage VINTS and the line for internal power supply voltage VINTSP are connected to each other through transistor QP1. When signal R1T and signal PDCKE are turned on in respective significant periods, i.e., in the active standby period and the device standby period of the semiconductor device, internal power supply voltage VINTSP generated by VINTSP generating circuit 11 is output as internal power supply voltage VINTS.

Transistors Q1, Q2 comprise transistors that are of a relatively large size so that they can supply a required current to each sense amplifier SA which serves as a load for internal power supply voltage VINTS in the overdrive period. FIG. 4 shows an example wherein transistor Q4 has a size "1" and each of transistors Q1, Q2 has a size "1000". In order to supply a required current to each sense amplifier SA so as to maintain the level of internal power supply voltage VINTS during a paging operation (to write data into and to read data from certain memory cells) after the memory cells have been restored, it is assumed that, for example, transistor Q4 has a size "1" and transistor Q3 has a size "100". The size of a transistor represents the current supply capability of the transistor, which depends on W/L (gate width/gate length). Generally, the current supply capability of a transistor is indicated by W (gate width) when L (gate length) is of a common value.

The devices shown in FIG. 4, except for pulse generating circuit 12 and NAND circuit NAND1, i.e., differential amplifiers comp.1 through comp.3, inverter INV1, inverters INV3, INV4, NOR circuit N01, OR circuit OR1, etc., operate under external power supply voltage VDD. Pulse generating circuit 12 and NAND circuit NAND1 operate under an internal power supply voltage (≠VINTS) which is a given potential voltage lower than external power supply voltage VDD. A voltage shifter, not shown, is provided between pulse generating circuit 12 and NAND circuit NAND1 and the other devices.

In the example shown in FIG. 4, the line for internal power supply voltage VINTS and the line for external power supply voltage VDD are connected to each other by transistors Q1, Q2 in the overdrive period. However, the line for internal power supply voltage VINTS may be connected to a line for an increased voltage which is higher than external power supply voltage VDD or to a line for a lowered voltage which is lower than external power supply voltage VDD and higher than internal power supply voltage VINTS. In other words, according to the present invention, internal power supply voltage VINTS may be increased in the overdrove period, and there is no limitation posed on the destination to which increased internal power supply voltage VINTS is applied. A booster circuit for generating an increased voltage or a voltage lower control circuit for generating a lowered voltage may comprise a known circuit.

As shown in FIG. 5, when an active command from an external circuit is input to the semiconductor device according to the first exemplary embodiment, which shifts the semiconductor device from the device standby mode to the device active mode, signal R1T goes high, activating word line WL to start an initial access phase for a memory cell. When the initial access phase for the memory cell is started, sense amplifier SA is activated by timing signals SAPE, SANE to start its sensing operation, which results in charging bit line BLZ or BLX to increase its potential voltage. When word line WL is activated, it is supplied with an increased voltage, e.g., of 2.6 V, higher than external power supply voltage VDD, generated by the booster circuit. When sense amplifier SA is activated, the line for timing signal SAPE is supplied with the increased voltage, e.g., of 2.6 V, and the line for timing signal SANE is supplied with external power supply voltage VDD, e.g., of 1.8 V.

When signal R1T goes high and signal RSAPB goes low, pulse generating circuit 12 generates a one-shot pulse signal. Signal NG1 shown in FIG. 4 goes low (VSS), turning on transistor Q1 (VGS=external power supply voltage VDD) to connect the line for internal power supply voltage VINTS and the line for external power supply voltage VDD to each other. In the device standby mode, VINTSP generating circuit 11 equalizes the potential voltage of internal power supply voltage VINTS to the final drive voltage of sense amplifier SA.

When sense amplifier SA is thereafter activated, a load current flows into VINTS generating circuit 10. If internal power supply voltage VINTS becomes lower than reference voltage VREFARY (a prescribed voltage (=1.1 V)) because transistor Q1 has an insufficient current supply capability, then signal NG2 output from differential amplifier comp.1 of voltage compensating circuit 13 goes low, turning on transistor Q2 (VGS=external power supply voltage VDD) to increase the current supply capability of internal power supply voltage VINTS.

As shown in FIGS. 5 and 6, internal power supply voltage VINTS increases up to external power supply voltage VDD (=1.8 V). As shown in FIG. 6, the voltage of the high-potential drive signal line (PCS) of sense amplifier SA also increases approximately up to external power supply voltage VDD. Consequently, the overdrive mode for increasing the sensing start voltage is realized, thus shortening the sensing time of sense amplifier SA.

According to the present exemplary embodiment, the gates of transistors Q1, Q2 shown in FIG. 4 are supplied with ground potential voltage VSS or external power supply voltage VDD, thus fully driving transistors Q1, Q2 to operate as switches. Therefore, the electric power consumption of transistors Q1, Q2 is reduced. The electric power consumption of differential amplifier comp.2 which energizes transistor Q2 including the size "1000" may be smaller than the electric power consumption of a differential amplifier which energizes a transistor including a size "2000" which is equal to the sum of the sizes of transistors Q1, Q2. Furthermore, since transistor Q2 for assisting in the current supply capability of transistor Q1 operates with VGS=VDD, the size of transistor Q2 can be much smaller than the size of transistor Q3 if transistor Q3 and differential amplifier comp.2 which control transistor Q3 with an analog signal realize the same assisting function.

The compensating operation (assisting operation) of transistor Q2 for the current supply capability of transistor Q1 ends when signal RSAPB goes high. As described above, signal RSAPB goes low when sense amplifier SA starts its sensing operation, and goes high when the charging of the bit lines is finished. According to the present exemplary embodiment, the period in which signal RSAPB is low is used as the overdrive (VOD) period.

When the sensing operation is started and signal PDCKE goes low, first regulator 14 has its differential amplifier comp.2 activated and operating to keep internal power supply voltage VINTS at the level of the prescribed voltage (=1.1 V).

When sense amplifier SA starts its sensing operation, the bit lines are charged, and the potential voltage of the high-potential bit line (bit line BLZ in FIG. 5) reaches 95 through 98% of internal power supply voltage VINTS, the restoration of memory cell MC is finished. Thereafter, the semiconductor device changes to a state (active standby mode) capable of accepting input commands for a paging operation such as a write command and a read command. At this time, word line WL and sense amplifier SA remain activated.

When signal PDCKE goes low while the semiconductor device is in the active standby mode, differential amplifier comp.2 of first regulator 14 is inactivated, and differential amplifier comp.3 of VINTSP generating circuit 11 is activated. Transistor QP1 is turned on, allowing VINTSP generating circuit 11 to keep internal power supply voltage VINTS at the level of the prescribed voltage (=1.1 V).

After the initial access period for memory cell MC is finished, when a second access period for the semiconductor device is started, e.g., when a write command is entered from an external circuit, signal PDCKE goes low, activating differential amplifier comp.2, so that first regulator 14 including transistor Q3 and differential amplifier comp.2 maintain internal power supply voltage VINTS at the level of the prescribed voltage (=1.1 V). Differential amplifier comp.2 (transistor Q3) and differential amplifier comp.3 (transistor Q4) are switched over in order to reduce power consumption and noise suppression (to prevent the sense amplifier signal from being erroneously inverted by the suppressing noise from data transfer bus 103). The reduction of power consumption is prioritized in the active standby mode, and the suppression of noise is prioritized in the second access period.

When signal R1T goes low while the semiconductor device is in the device standby mode (not operated), differential amplifier comp.2 of first regulator 14 is inactivated. At this time, transistor QP1 is turned on, allowing VINTSP generating circuit 11 that includes transistor Q4 and differential amplifier comp.3 to maintain internal power supply voltage VINTS at the level of the prescribed voltage (=1.1 V).

As described above, when the semiconductor device is in the device standby mode, VINTSP generating circuit 11 supplies a small current consumed as a leakage current, etc. to maintain internal power supply voltage VINTS at the level of the prescribed voltage. Therefore, transistor Q4 may comprise a small size transistor.

Generally, a transistor capable of outputting a large current tends to have a small input impedance and a large input capacitance. If the size of transistor Q4 is reduced, its input impedance is increased and its input capacitance is reduced, with the result that the electric power consumption of its drive circuit is reduced. In other words, the current consumed by differential amplifier comp.3 which drives transistor Q4 is reduced. Consequently, the electric power consumption of the semiconductor device in the device standby mode and in the active standby mode is reduced.

Transistor QP1 is provided in each bank. As shown in FIG. 2, VINTS generating circuit 10 provided in each bank is inactivated when the restoration of the bank is finished, whereupon VINTS generating circuit 10 enters a mode of maintaining internal power supply voltage VINTS. Signal RSAPB, signal R1T, and signal PDCKE are supplied to each bank. Signal SAPE and signal SANE for activating sense amplifier SA are also supplied to each bank.

Even though the semiconductor device has a plurality of banks each combined with VINTS generating circuit 10, as shown in FIG. 2, VINTSP generating circuit 11 may be able to compensate for leakage current in each bank which flows in the device standby mode to maintain the level of internal power supply voltage VINTS. VINTSP generating circuit 11 may be provided in each bank by dispensing with transistor QP1 and OR circuit OR1. However, it is preferable to reduce the circuit area required by VINTSP generating circuit 11 by sharing VINTSP generating circuit 11 between a plurality of banks.

VINTSP generating circuit 11 may be operated at all times by supplying external power supply voltage VD to the gate of transistor Q15. The amplitude values of signals shown in FIG. 5 whose voltages are not described are in the range from internal power supply voltage (≠VINTS) to VSS. In FIG. 5, NG5 refers to the output signal of differential amplifier comp.2D of a semiconductor device according to a second exemplary embodiment to be described later.

The gradient of internal power supply voltage VINTS which drops as a current is consumed by sense amplifier SA when it is activated, i.e., the ratio of the current consumed by sense amplifier SA as a load to the current supplied by transistor Q1, varies with PVT (process, voltage, temperature) variations. The current that can be supplied by transistor Q1 also varies with PVT variations. In the overdrive mode, transistor Q1 is controlled by a time not related to the above gradient, i.e., the pulse duration of the one-shot pulse signal, and the time also varies with PVT variations.

Therefore, changes in the above gradient and the time in which transistor Q1 is turned on do not necessarily conform with each other. The overdrive effect is not stably achieved by an arrangement wherein internal power supply voltage VINTS is increased by only transistor Q1.

The semiconductor device according to the present exemplary embodiment has voltage compensating circuit 13 including differential amplifier comp.1 (first differential amplifier) independent of PVT variations, and transistor Q2 which compensates for a reduction in internal power supply voltage VINTS in its switching operation. Since the above gradient is greater, transistor Q2 operates to assist at an earlier time in improving (reducing) the above gradient.

The on time of differential amplifier comp.1 is also controlled by signal RSAPB. Since the period in which signal RSAPB is significant is longer than the on time of transistor Q1, the current supply capability for supplying a current to first drive signal line PCS which supplies a power supply voltage (internal power supply voltage VINTS) to each sense amplifier SA can be increased without excessively increasing internal power supply voltage VINTS.

With the semiconductor device according to the present exemplary embodiment, therefore, even if the on time of transistor Q1 varies with PVT variations, since the overdrive mode of transistor Q2 which is digitally controlled is assisted, the drop in internal power supply voltage VINTS due to an increased load current is reduced, thus providing a stable overdrive effect. The current consumed by the semiconductor device can be reduced by operating, as switches, transistors Q1, Q2 which supply a current to sense amplifier SA in the overdrive mode and by turning off transistors Q1, Q2 after the overdrive mode. In the device standby mode and the active standby mode, VINTSP generating circuit (second regulator) 11 including small size transistor Q4 maintains the level of internal power supply voltage VINTS. Therefore, the electric power consumption of the semiconductor device is reduced in the device standby mode and the active standby mode.

Modifications of 1st Exemplary Embodiment

Voltage compensating circuit 13 shown in FIG. 4 may be modified by replacing NOR circuit NOR1 with NAND circuit NAND and replacing RSAPB signal input to NOR circuit NOR1 with a first control signal (NG1). Voltage compensating circuit 13 thus modified activates the overdrive function of transistor Q2 if internal power supply voltage VINTS is lower than reference voltage VREFARY after the overdrive period of transistor Q1 controlled by pulse generating circuit 12 is finished. Therefore, even if the overdrive mode carried out by the one-shot pulse signal is finished at the time the overdrive mode is still required, the overdrive function will be realized by transistor Q2 in place of transistor Q1.

2nd Exemplary Embodiment

Figure 7:
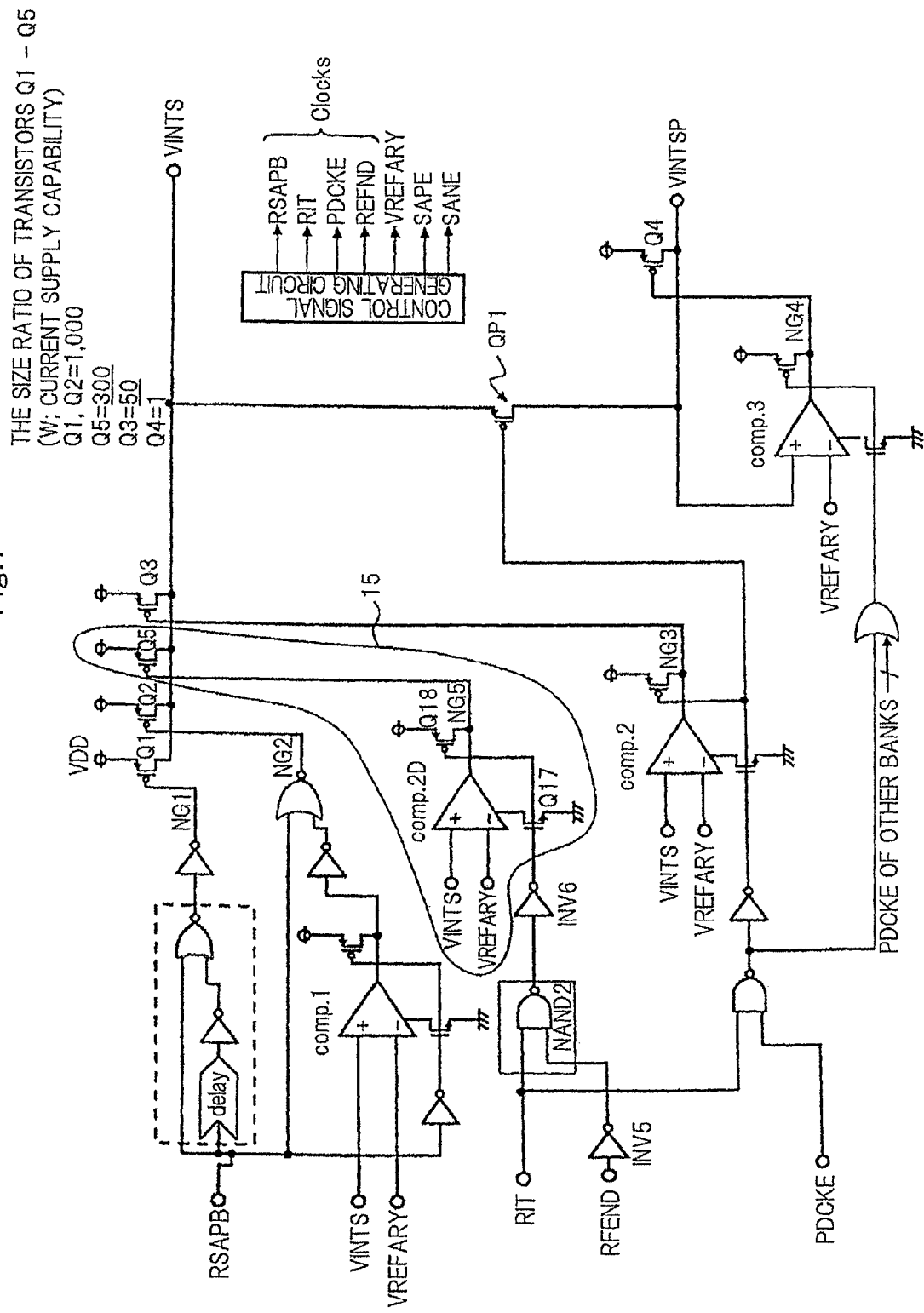
FIG. 7 is a circuit diagram showing a configurational example of a VINTS generating circuit and a VINTSP generating circuit according to a second exemplary embodiment of the present invention.

FIG. 7 is a circuit diagram showing a configurational example of a VINTS generating circuit and a VINTSP generating circuit according to a second exemplary embodiment of the present invention.

As shown in FIG. 7, the VINTS generating circuit according to the second exemplary embodiment comprises VINTS generating circuit 10 according to the first exemplary embodiment shown in FIG. 4 and a third regulator (fifth control circuit) 15 added thereto. Other configurational and operational details of the VINTS generating circuit according to the second exemplary embodiment are identical to those of the first exemplary embodiment and will not be described in detail below.

Third regulator 15 includes differential amplifier comp.2D, transistor Q17 for activating or inactivating differential amplifier comp.2D, transistor Q18 for securing the output signal from differential amplifier comp.2D at a high level (VDD) when differential amplifier comp.2D is shut down (inactivated), and transistor Q5 which is controlled by an analog signal, transistor Q5 including a source for being supplied with external power supply voltage VDD, a gate for being supplied with the output signal from differential amplifier comp.2D and a drain for outputting internal power supply voltage VINTS.

Transistor Q17 is supplied with a signal generated by ANDing signal R1T and signal RFEND with inverter INV5, NAND circuit NAND2, and inverter INV6, and is turned on during a period in which these signals are significant. Signal RFEND is a signal indicating when the restoration of a memory cell is finished, and goes low when a sensing operation is started and goes high when the restoration of the memory cell is finished. According to the present exemplary embodiment, the period in which third regulator 15 is activated is determined using signal RFEND.

When transistor Q17 is turned on, differential amplifier comp.2D is activated, amplifies the difference between internal power supply voltage VINTS and reference voltage VREFARY, and outputs the amplified difference as a fifth control signal to energize transistor Q5. Since internal power supply voltage VINTS is applied through a feedback loop to differential amplifier comp.2D, differential amplifier comp.2D and transistor Q5 operate to bring internal power supply voltage VINTS to coincide with reference voltage VREFARY. Therefore, transistor Q5 is activated when internal power supply voltage VINTS is lower than reference voltage VREFARY.

Transistor Q5 may comprise a transistor which is larger in size and has a larger current supply capability than transistor Q3 of first regulator 14. As shown in FIG. 7, if transistor Q4 has a size "1", then transistor Q3 may comprise a transistor including a size "50" and transistor Q5 may comprise a transistor including a size "300".

The semiconductor device according to the second exemplary embodiment offers the same advantages as the semiconductor device according to the first exemplary embodiment by adding third regulator 15 to the semiconductor device according to the first exemplary embodiment. Since the current supply capability of internal power supply voltage VINTS is increased at the time that the memory cell is restored after the overdrive mode is finished, the level of internal power supply voltage VINTS is more stable when the memory cell is restored than in the semiconductor device according to the first exemplary embodiment. Furthermore, inasmuch as transistor Q3 of first regulator 14 may comprise a transistor whose current supply capability is lower than in the first exemplary embodiment, the electric power consumption of differential amplifier comp.2 can be reduced. Accordingly, the semiconductor device according to the second exemplary embodiment consumes lower electric power in the write mode than the semiconductor device according to the first exemplary embodiment.

According to the second exemplary embodiment, moreover, since the operation of transistor Q5 is controlled by signal RFEND and the operation of transistor Q3 is controlled by signal PDCKE, it is possible to operate transistor Q5 until the potential voltage of the bit line reaches 95 through 98% of its final voltage (VINTS=1.1 V) and to operate transistor Q3 until the potential voltage of the bit line reaches 100% of its final voltage (VINTS=1.1 V) when the memory cell is restored. Therefore, the time required to restore the memory cell after the overdrive mode is finished can be shortened.

The exemplary embodiments of the present invention have been described above. However, the basic technical concept of the present invention is not limited to the above exemplary embodiments. Specifically, though an access command is applied from an external circuit to the semiconductor device in the first and second exemplary embodiments, the basic technical concept of the present invention is also applicable where a refresh command is applied from an external circuit to the semiconductor device or where the memory cells are refreshed in each given cyclic period by an internal timer, which is asynchronous with an external circuit, within the semiconductor device. In the first and second exemplary embodiments, a DRAM with an overdrive function has been described as the semiconductor device. However, the basic technical concept of the present invention may be applied to other semiconductor devices. For example, the principles of the present invention are applicable to a wide range of semiconductor devices that have a memory function, including a CPU (Central Processing Unit), an MCU (Micro Control Unit), a DSP (Digital Signal Processor), an ASIC (Application Specific Integrated Circuit), an ASSP (Application Specific Standard Circuit), etc. Furthermore, the principles of the present invention are applicable to semiconductor devices with no memory function. In other words, the basic technical concept of the present invention is not limited to sense amplifiers for amplifying memory cell information, but may be applied to sense amplifiers for processing signals in logic circuits such as ASICs and processing data signals in DSPs. Therefore, the claims of the present application should not be interpreted as being limited to storage devices. Product forms of semiconductor devices to which the present invention is applicable include an SOC (System On Chip), an MCP (Multi-Chip Package), a POP (Package On Package), etc. The principles of the present invention are applicable to semiconductor devices in such product forms and package forms.

The transistors of the semiconductor devices to which the present invention is applicable comprise field effect transistors (FETs). FETs may be MOS (Metal Oxide Semiconductor) FETs, MIS (Metal Insulator Semiconductor) FETs, TFT (Thin Film Transistor) FETs, etc. The principles of the present invention are also applicable to semiconductor devices including bipolar transistors and FETs.

A P-channel transistor or a PMOS transistor is an example of a transistor of a first conductivity type, and an N-channel transistor or a NMOS transistor is an example of a transistor of a second conductivity type. A semiconductor substrate for use in a semiconductor device may be a P-type semiconductor substrate, an N-type semiconductor substrate, an SOI (Silicon On Insulator) semiconductor substrate, or any of the other semiconductor substrates.

The circuit configurations of pulse generating circuits, sense amplifiers, differential amplifiers, memory cells, etc. are not limited to those disclosed in the illustrated exemplary embodiments and examples.

Although the inventions has been described above in connection with several preferred embodiments thereof, it will be appreciated by those skilled in the art that those embodiments are provided solely for illustrating the invention, and should not be relied upon to construe the appended claims in a limiting sense.

The invention claimed is:

1. A semiconductor device comprising:
   a sense amplifier;
   a first power supply line supplying a high-potential voltage equal to or higher than a first power supply voltage to said sense amplifier;
   a second power supply line supplying a second power supply voltage higher than said high-potential voltage;
   a first transistor, a second transistor, and a third transistor including respective drain terminals and source terminals connected between said first power supply line and said second power supply line; and
   a first control circuit, a second control circuit, and a third control circuit applying a first control signal, a second control signal, and a third control signal, respectively, to gate terminals of said first transistor, said second transistor, and said third transistor;
   wherein said second control circuit and said third control circuit including a first operational amplifier and a second operational amplifier, respectively;
   said first control signal and said second control signal comprise digital signals including a first differential voltage between said first power supply voltage and a ground voltage and including a potential voltage that is selectively changeable to two values represented by said first power supply voltage and said ground voltage, respectively;
   said third control signal comprises an analog signal including a second differential voltage smaller than said first differential voltage and including a potential voltage that is changeable between said first power supply voltage and said ground voltage, respectively;
   said first control circuit generates said first control signal to render said first transistor electrically conductive or nonconductive;
   said second control circuit generates said second control signal which is a digital signal converted from an analog signal detected by said first operational amplifier to render said second transistor electrically conductive or nonconductive; and
   said third control circuit outputs an analog signal detected by said second operational amplifier as said third control signal to render said third transistor electrically conductive or nonconductive.

2. The semiconductor device according to claim 1, wherein a potential voltage of said first power supply line controlled by said first transistor and said second transistor so as to be equal to or higher than said first power supply voltage, and controlled by said third transistor so as to be equal to said first power supply voltage.

3. The semiconductor device according to claim 2, wherein said first operational amplifier and said second operational amplifier compare the voltage supplied by said first power supply line and said first power supply voltage with each other, and control said second transistor and said third transistor to bring the voltage supplied by said first power supply line to coincide with said first power supply voltage when the voltage supplied by said first power supply line is lower than said first power supply voltage.

4. The semiconductor device according to claim 3, wherein said first control circuit operates in a first period from a first time point to a second time point; and
   said second control circuit operates in a second period from said first time point to a third time point, said second period being longer than said first period;
   said third control circuit operates in a third period from at least said third time point to a fourth time point.

5. The semiconductor device according to claim 3, wherein said first control circuit operates in a first period from a first time point to a second time point;
   said second control circuit operates in a second period from said second time point to a third time point; and
   said third control circuit operates in a third period from at least said third time point to a fourth time point.

6. The semiconductor device according to claim 4, wherein said first period, said second period, and said third period comprise a device active period in which said semiconductor device is accessed from an external circuit.

7. The semiconductor device according to claim 4, wherein said third control circuit operates in a fourth period from said first time point to said fourth time point, said fourth period being longer than said second period.

8. The semiconductor device according to claim 7, wherein said first period, said second period, and said fourth period comprise a device active period in which said semiconductor device is accessed from an external circuit.

9. The semiconductor device according to claim 4, further comprising:
   a fourth transistor including a drain terminal and a source terminal connected between said first power supply line and said second power supply line; and
   a fourth control circuit including a third operational amplifier, applying a fourth control signal to a gate terminal of said fourth transistor, the fourth control signal is an analog signal detected by said third operational amplifier, said analog signal has an analog characteristic;
   wherein said fourth control circuit operates in a device standby period in which said semiconductor is not accessed by an external circuit.

10. The semiconductor device according to claim 4, further comprising:
    a fifth transistor including a drain terminal and a source terminal connected between said first power supply line and said second power supply line; and
    a fifth control circuit including a fourth operational amplifier, applying a fifth control signal to a gate terminal of said fifth transistor, the fifth control signal is an analog signal detected by said fourth operational amplifier, said analog signal has an analog characteristic;
    wherein said fifth control circuit operates in a fifth period from at least said third time point to a fifth time point, said fifth period being shorter than said third period.

11. The semiconductor device according to claim 10, wherein said first period, said second period, said third period, and said fifth period comprise a device active period in which said semiconductor device is accessed from an external circuit.

12. The semiconductor device according to claim 10, wherein said third control circuit operates in a fourth period from said first time point to said fourth time point, said fourth period being longer than said second period; and said fifth control circuit operates in a sixth period from said first time point to said fifth time point, said sixth period being longer than said second period and shorter than said fourth period.

13. The semiconductor device according to claim 12, wherein said first period, said second period, said third period, and said sixth period comprise a device active period in which said semiconductor device is accessed from an external circuit.

14. The semiconductor device according to claim 3, wherein said first transistor and said second transistor have a gate width, which represents a driving capability thereof, greater than a gate width of said third transistor.

15. The semiconductor device according to claim 9, wherein said third transistor has a gate width, which represents a driving capability thereof, greater than a gate width of said fourth transistor.

16. The semiconductor device according to claim 10, further comprising:
    a fourth transistor including a drain terminal and a source terminal connected between said first power supply line and said second power supply line; and
    a fourth control circuit including a third operational amplifier, applying a fourth control signal which is an analog signal detected by said third operational amplifier to a gate terminal of said fourth transistor;
    wherein said first transistor and said second transistor have a gate width, which represents a driving capability thereof, both of said gate width of first transistor and said gate width of second transistor greater than a gate width of said fifth transistor;
    said gate width of said fifth transistor, which represents a driving capability thereof, said gate width of fifth transistor is greater than a gate width of said third transistor; and
    said gate width of said third transistor, which represents a driving capability thereof, said gate width of third transistor is greater than a gate width of said fourth transistor.

17. A method of controlling a semiconductor device, comprising:
    when a memory cell is accessed, controlling a first transistor to change a power supply voltage for a sense amplifier to a second power supply voltage which is higher than a first power supply voltage;
    activating said sense amplifier to sense information of said memory cell;
    controlling a second transistor to bring the power supply voltage for said sense amplifier to coincide with said first power supply voltage when the power supply voltage for said sense amplifier changes to a voltage which is lower than said first power supply voltage upon sensing the information of said memory cell;
    controlling a third transistor to bring the power supply voltage for said sense amplifier to coincide with said first power supply voltage after at least said first transistor and said second transistor have been controlled; and
    continuously controlling said second transistor after at least said first transistor has been controlled.

18. The method according to claim 17, wherein said first transistor is controlled in a first period from a first time point to a second time point;
    said second transistor is controlled in a second period from said first time point to a third time point, said second period being longer than said first period; and
    said third transistor is controlled in a third period from at least said third time point to a fourth time point.

19. The method according to claim 17, wherein said first transistor is controlled in a first period from a first time point to a second time point;
    said second transistor is controlled in a second period from said second time point to a third time point; and
    said third transistor is controlled in a third period from at least said third time point to a fourth time point.

20. The method according to claim 17, wherein said first transistor and said second transistor are controlled in a first period from a first time point to a second time point;
    said second transistor is controlled by a digital signal including a first differential voltage between said first power supply voltage and a ground voltage and including a potential voltage selectively changeable to two values represented by said first power supply voltage and said ground voltage, respectively; and
    said third transistor is controlled by an analog signal including a second differential voltage smaller than said first differential voltage and including a potential voltage changeable between said first power supply voltage and said ground voltage.

* * * * *